United States Patent
Chang et al.

(10) Patent No.: US 10,121,938 B2
(45) Date of Patent: Nov. 6, 2018

(54) LIGHT SOURCE MODULE

(71) Applicant: Radiant Opto-Electronics Corporation, Kaohsiung (TW)

(72) Inventors: Chia-Yin Chang, Kaohsiung (TW); Chin-Ting Weng, Kaohsiung (TW)

(73) Assignee: Radiant Opto-Electronics Corporation, Kaohsiung (TW)

( * ) Notice: Subject to any disclaimer, the term of this patent is extended or adjusted under 35 U.S.C. 154(b) by 26 days.

(21) Appl. No.: 14/315,349

(22) Filed: Jun. 26, 2014

(65) Prior Publication Data

US 2015/0280075 A1 Oct. 1, 2015

(30) Foreign Application Priority Data

Mar. 31, 2014 (TW) .................................. 103111968

(51) Int. Cl.
*H01L 25/075* (2006.01)
*H01L 33/44* (2010.01)
*H01L 33/58* (2010.01)

(52) U.S. Cl.
CPC .......... *H01L 33/44* (2013.01); *H01L 25/0753* (2013.01); *H01L 33/58* (2013.01); *H01L 2924/0002* (2013.01)

(58) Field of Classification Search
CPC .......... H01L 25/07; H01L 33/44; H01L 33/58
USPC .................................................... 257/88, 90
See application file for complete search history.

(56) References Cited

U.S. PATENT DOCUMENTS

| 2002/0140880 | A1* | 10/2002 | Weindorf | G02B 6/0023 349/70 |
| 2008/0237611 | A1* | 10/2008 | Cok | B82Y 20/00 257/79 |
| 2013/0258247 | A1* | 10/2013 | Tang | G02B 6/0023 349/65 |
| 2015/0070931 | A1* | 3/2015 | Lin | G02B 6/0031 362/609 |

FOREIGN PATENT DOCUMENTS

| CN | 102620205 A | 8/2012 |
| CN | 103175034 A | 6/2013 |
| EP | 1944629 A1 | 7/2008 |
| JP | S64-18508 U | 1/1989 |
| JP | 2002-343122 A | 11/2002 |
| JP | 2005-251687 A | 9/2005 |
| JP | 2005-321754 A | 11/2005 |
| JP | 2013-016278 A | 1/2013 |
| TW | 464784 | 11/2001 |
| TW | M294665 | 7/2006 |

(Continued)

*Primary Examiner* — Lynne Gurley
*Assistant Examiner* — Vernon P Webb
(74) *Attorney, Agent, or Firm* — CKC & Partners Co., Ltd.

(57) ABSTRACT

A light source module is provided. The light source module includes a flexible printed circuit board, plural light-emitting diodes and plural first light-absorbing portions. The flexible printed circuit board has a first edge and a second edge opposite to the first edge. The light-emitting diodes are disposed on the flexible printed circuit board near the first edge. The first light-absorbing portions are disposed on the flexible printed circuit board near the second edge, in which the first light-absorbing portions are alternately arranged with the light-emitting diodes.

17 Claims, 12 Drawing Sheets

(56) References Cited

FOREIGN PATENT DOCUMENTS

| TW | 200700797 | 1/2007 |
|----|-----------|--------|
| TW | M353375 | 3/2009 |
| TW | M381089 U | 5/2010 |
| TW | 201350731 A | 12/2013 |

\* cited by examiner

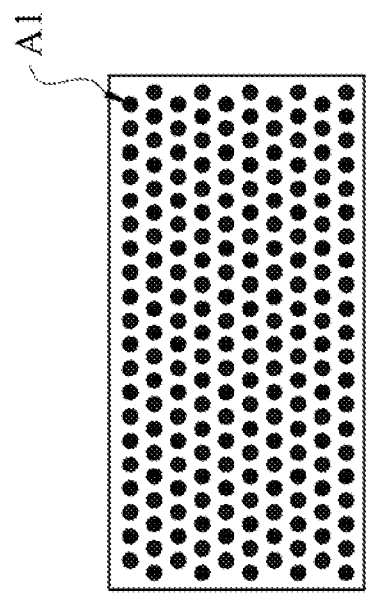

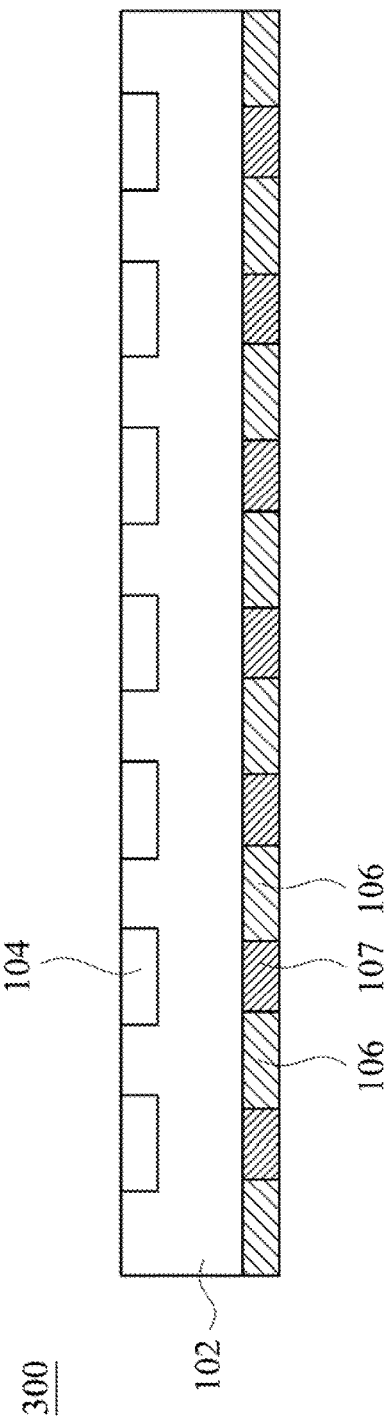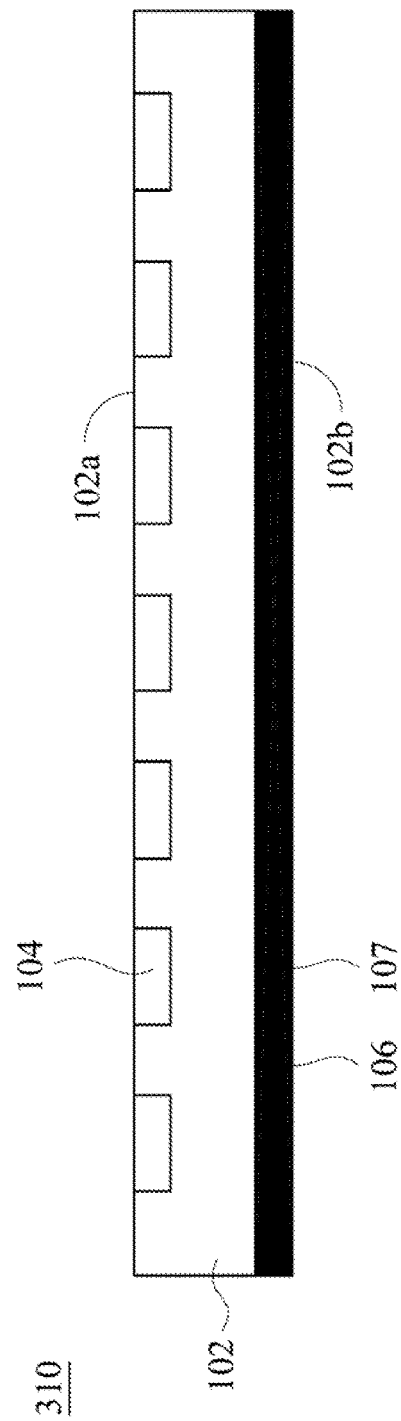

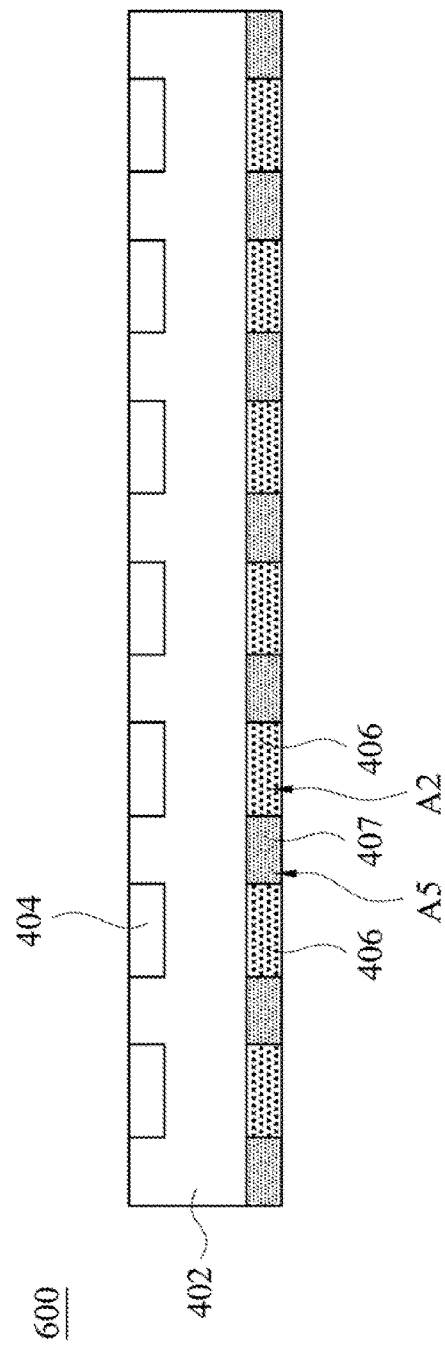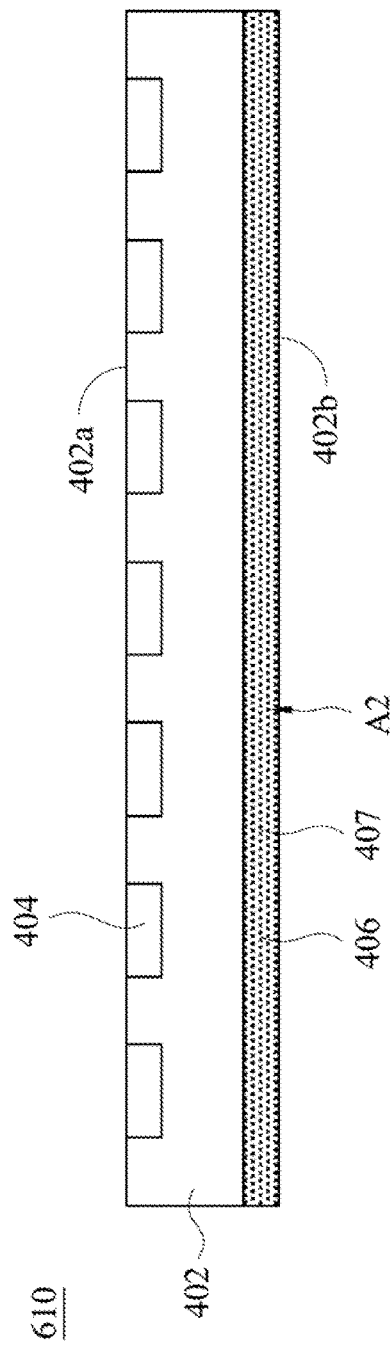

LIGHT SOURCE MODULE

RELATED APPLICATIONS

This application claims priority to Taiwan Application Serial Number 103111968, filed Mar. 31, 2014, which is herein incorporated by reference.

BACKGROUND

Field of Invention

The present invention relates to a light source element. More particularly, the present invention relates to a light source module.

Description of Related Art

A conventional backlight module mainly includes a light bar and a light guide plate. The light bar includes a circuit board and light emitting diodes disposed on a surface of the circuit board, in which light-emitting surfaces of the light emitting diodes are vertical to the surface of the circuit board. The light guide plate is disposed by the light emitting diodes, in which a light-incident surface of the light guide plate abuts the light-emitting surfaces of the light emitting diodes, thereby effectively increasing light use efficiency of the light emitting diodes.

However, because the light-incident surface of the light guide plate abuts the light-emitting surfaces of the light emitting diodes, bright bands or luminance non-uniformity problems are likely to be generated on the light guide plate near the light emitting diodes, thus seriously affecting the appearance of the light guide plate. A general solution is to blacken the entire surface of the circuit board, so that portions of the light emitted from the light emitting diodes can be absorbed by the blackened surface. Although the aforementioned solution improves the problem of the bright bands, yet the overall luminance of the backlight module is decreased accordingly.

SUMMARY

One object of the present invention is to provide a light source module, in which light-absorbing portions are used to absorb portions of light emitted from light-emitting diodes, and meanwhile a blank portion is used to reflect the light. Therefore, when the light source module of the present invention is applied to a backlight module, bright bands can be prevented from being generated near a light-incident surface of the light guide plate, thereby increasing luminance of the light guide plate.

According to the aforementioned objects, a light source module is provided. The light source module includes a flexible printed circuit board, plural light-emitting diodes and plural first light-absorbing portions. The flexible printed circuit board has a first edge and a second edge opposite to the first edge. The light-emitting diodes are disposed on the flexible printed circuit board near the first edge. The first light-absorbing portions are disposed on the flexible printed circuit board near the second edge, in which the first light-absorbing portions are alternately arranged with the light-emitting diodes.

According to an embodiment of the present invention, each of the first light-absorbing portions is a coating-layer structure or formed by arranging plural dots on the flexible printed circuit board.

According to an embodiment of the present invention, the color of the coating-layer structure is black, gray, or gray-to-black gradient color.

According to an embodiment of the present invention, the color of the dots is black, gray, or a color combination of black and gray.

According to an embodiment of the present invention, a profile of each of the first light-absorbing portions is triangular, rectangular or semi-circular.

According to an embodiment of the present invention, the light source module further includes plural second light-absorbing portions respectively disposed between every two adjacent first light-absorbing portions.

According to an embodiment of the present invention, the light-absorbing ability of the first light-absorbing portions is equal to the light-absorbing ability of the second light-absorbing portions.

According to an embodiment of the present invention, the light-absorbing ability of the first light-absorbing portions is greater than the light-absorbing ability of the second light-absorbing portions.

According to an embodiment of the present invention, the light-absorbing ability of the second light-absorbing portions is greater the light-absorbing ability of the first light-absorbing portions.

According to an embodiment of the present invention, a distance from a top end of each of the first light-absorbing portions and the second light-absorbing portions to the second edge is smaller than one half of a distance from the first edge to the second edge.

According to an embodiment of the present invention, the light source module further includes a blank portion disposed between the first light-absorbing portions and the light-emitting diodes.

According to the aforementioned objects, another light source module is provided. The light source module includes a flexible printed circuit board, plural light-emitting diodes and plural first light-absorbing portions. The flexible printed circuit board has a first edge and a second edge opposite to the first edge. The light-emitting diodes are disposed on the flexible printed circuit board near the first edge. The first light-absorbing portions are disposed on the flexible printed circuit board near the second edge, in which the first light-absorbing portions are arranged corresponding to the light-emitting diodes respectively, and each of the first light-absorbing portions is formed by arranging plural first dots on the flexible printed circuit board.

According to an embodiment of the present invention, a profile of each of the first light-absorbing portions is triangular, rectangular or semi-circular.

According to an embodiment of the present invention, the color of the first dots is black, gray, or a color combination of black and gray.

According to an embodiment of the present invention, the light source module further includes plural second light-absorbing portions respectively disposed between every two adjacent first light-absorbing portions.

According to an embodiment of the present invention, the light-absorbing ability of the first light-absorbing portions is equal to the light-absorbing ability of the second light-absorbing portions.

According to an embodiment of the present invention, the light-absorbing ability of the first light-absorbing portions is greater than the light-absorbing ability of the second light-absorbing portions.

According to an embodiment of the present invention, the light-absorbing ability of the second light-absorbing portions is greater than the light-absorbing ability of the first light-absorbing portions.

According to an embodiment of the present invention, a distance from a top end of each of the first light-absorbing portions and the second light-absorbing portions to the second edge is smaller than one half of a distance from the first edge to the second edge.

According to an embodiment of the present invention, the light source module further includes a blank portion disposed between the first light-absorbing portions and the light-emitting diodes.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 2 is a schematic structural diagram showing a first light-absorbing portion in accordance with the first embodiment of the present invention;

FIG. 4A and FIG. 4B are schematic diagrams showing two types of light source modules in accordance with a second embodiment of the present invention;

FIG. 7A-FIG. 7C are schematic structural diagrams showing two types of light source modules in accordance with a fourth embodiment of the present invention.

DETAILED DESCRIPTION

Figure 1A:
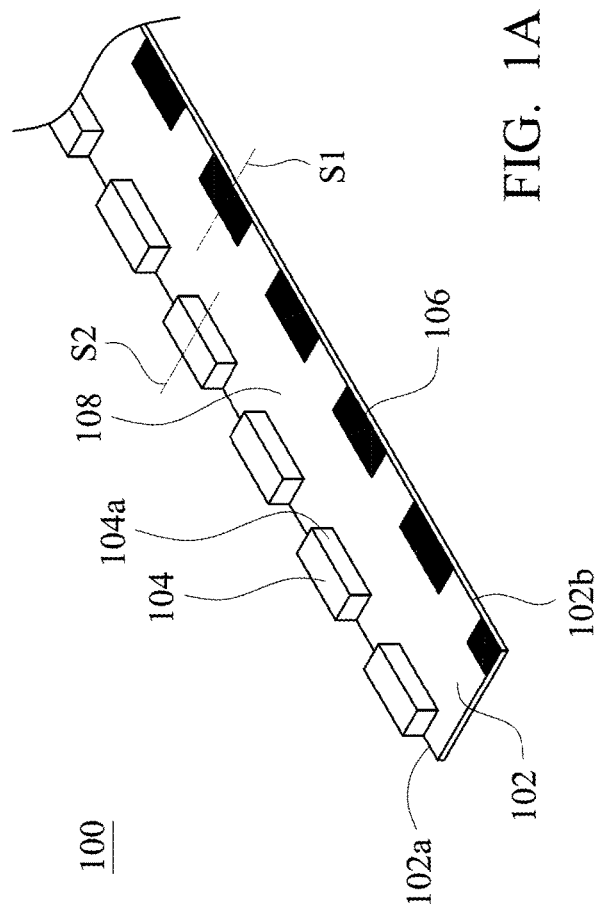
FIG. 1A is a schematic structural diagram showing a light source module in accordance with a first embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 1B:
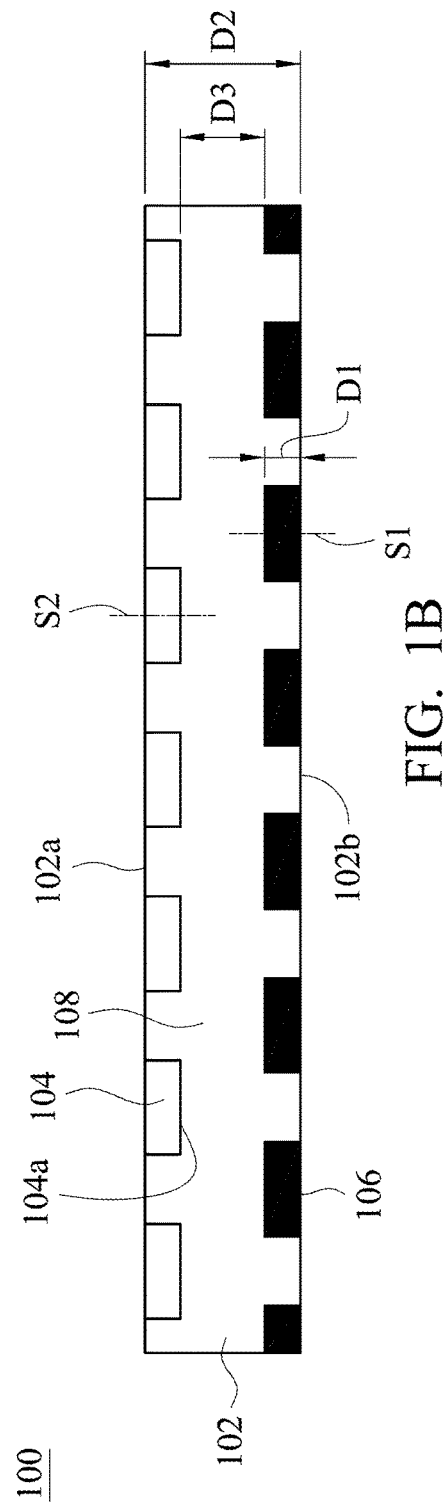
FIG. 1B is a schematic top view of the light source module in accordance with the first embodiment of the present invention.

Referring to FIG. 1A and FIG. 1B, FIG. 1A and FIG. 1B are schematic structural and top views showing a light source module 100 in accordance with a first embodiment of the present invention. In the present embodiment, the light source module 100 is applicable to a backlight module or a lamp. The light source module 100 includes a flexible printed circuit board 102, plural light-emitting diodes 104 and plural first light-absorbing portions 106. The flexible printed circuit board 102 has a first edge 102a and a second edge 102b opposite to each other. The light-emitting diodes 104 are disposed on the flexible printed circuit board 102 near the first edge 102a. The light-emitting diodes 104 are electrically connected to the flexible printed circuit board 102. The first light-absorbing portions 106 are disposed on the flexible printed circuit board 102 near the second edge 102b. In other words, the light-emitting diodes 104 and the first light-absorbing portions 106 are respectively disposed on the flexible printed circuit board 102 near the two opposite sides 102a and 102b, and the first light-absorbing portions 106 are separated from the light-emitting diodes 104 by a width D3 along a direction extending from the first edge 102a to the second edge 102b. The first light-absorbing portions 106 are mainly used to absorb portions of light emitted from the light-emitting diodes 104.

As shown in FIG. 1A and FIG. 1B, there is a blank portion 108 located between the first light-absorbing portions 106 and the light-emitting diodes 104. In other words, the first light-absorbing portions 106 do not directly contact light-emitting surfaces 104a of the light-emitting diodes 104. Therefore, portions of the light emitted from the light-emitting diodes 104 can be reflected by the blank portion 108. In addition, a distance D1 from a top end of each of the first light-absorbing portions 106 to the second edge 102b is smaller than one half of a distance D2 from the first edge 102a to the second edge 102b, in which the aforementioned "distance D1" refers to a length of the first light-absorbing portions 106 along a direction from the first edge 102a to the second edge 102b.

Figure 1C:
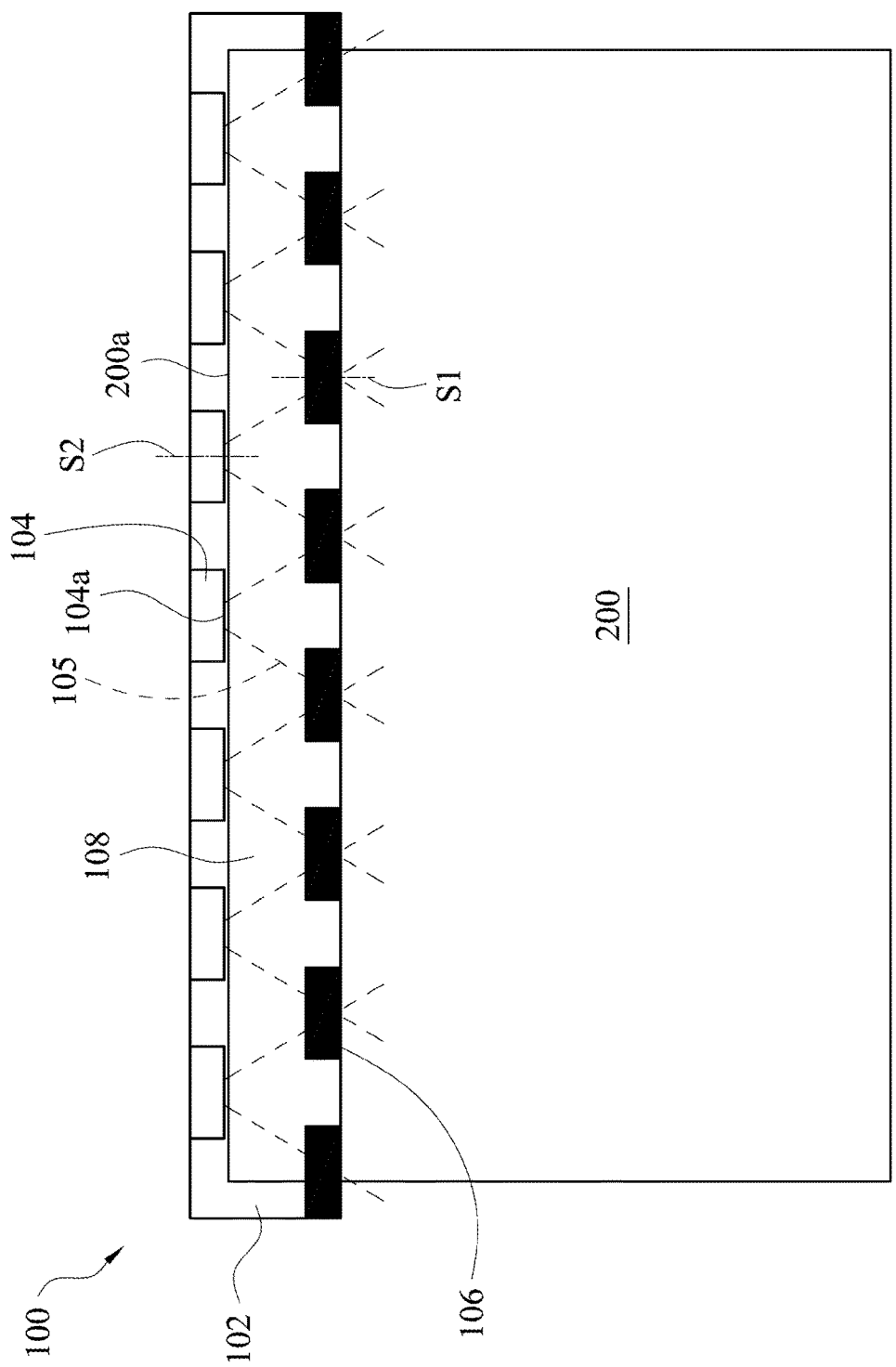
FIG. 1C is a schematic diagram showing the light source module in operation in accordance with the first embodiment of the present invention.
Figure 1D:
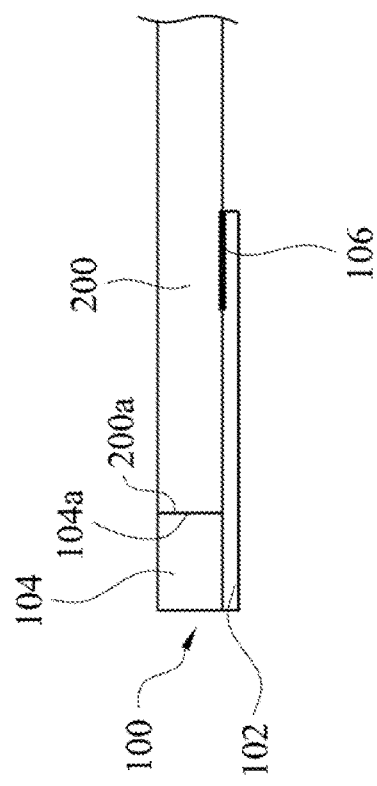
FIG. 1D is a schematic side view the light source module in operation in accordance with the first embodiment of the present invention.
Figure 1E:
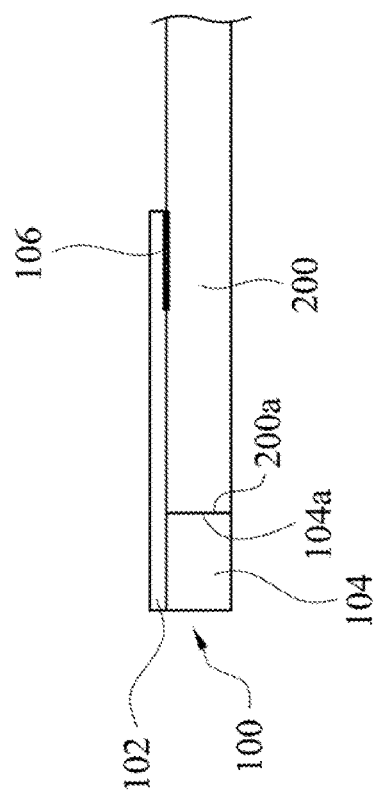
FIG. 1E is another schematic diagram showing the light source module in operation in accordance with the first embodiment of the present invention.

Referring to FIG. 1C and FIG. 1D, FIG. 1C and FIG. 1D are a schematic diagram and a schematic side view showing the light source module 100 in operation in accordance with the first embodiment of the present invention. When being applied to the backlight module, the light source module 100 is disposed on a side of a light guide plate 200 near a light-incident surface 200a of the light guide plate 200, and the light-emitting surfaces 104a of the light-emitting diodes 104 abut the light-incident surface 200a of the light guide plate 200. In one embodiment, a portion of the light guide plate 200 near the light-emitting diodes 104 is disposed on the flexible printed circuit board 102 and covers the first light-absorbing portions 106. In the examples shown in FIG. 1C and FIG. 1D, the flexible printed circuit board 102 is disposed under the light guide plate 200. Referring to FIG. 1E, FIG. 1E is another schematic diagram showing the light source module 100 in operation in accordance with the first embodiment of the present invention. In other embodiments, the flexible printed circuit board 102 can be disposed on the light guide plate 200 to meet different requirements. It is noted that, no matter whether the flexible printed circuit board 102 is disposed on or under the light guide plate 200, the first light-absorbing portions 106 of the light source module 100 are facing towards a surface of the light guide plate 200.

Figure 1F:
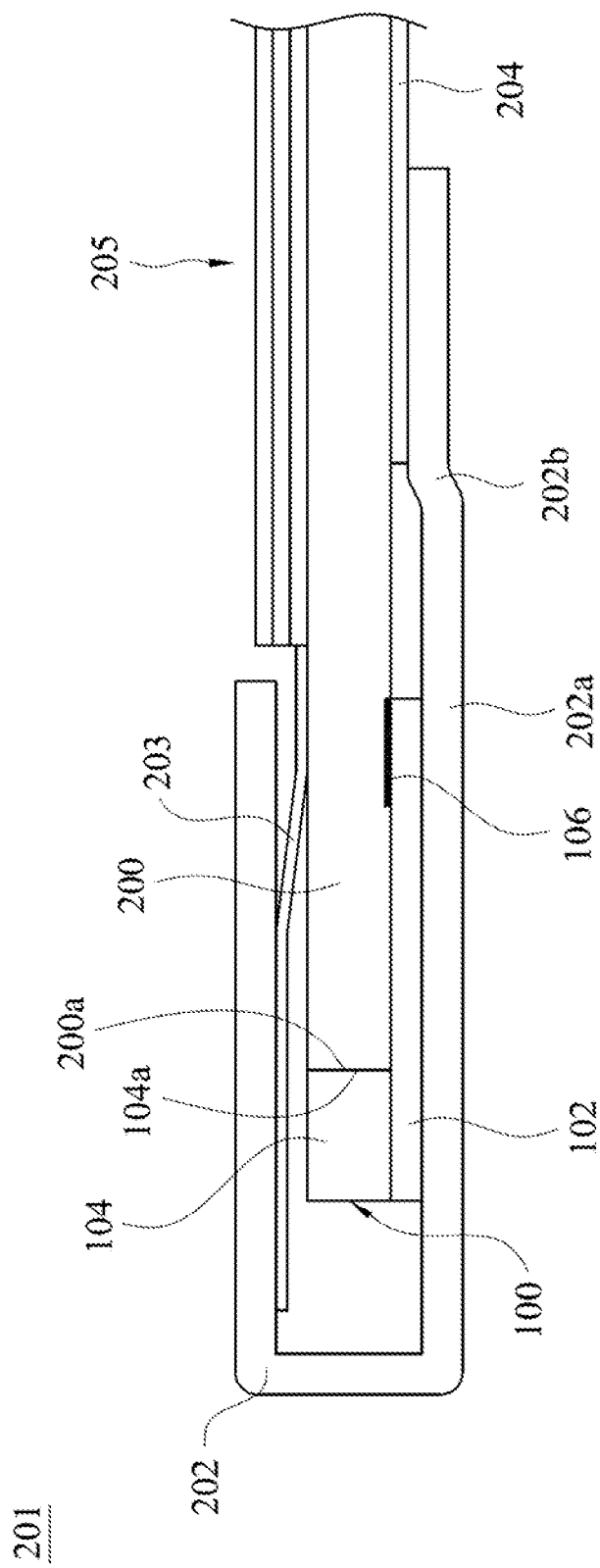
FIG. 1F is a schematic structural diagram showing a backlight module in accordance with the first embodiment of the present invention.

Referring to FIG. 1F, FIG. 1F is a schematic structural diagram showing a backlight module 201 in accordance with the first embodiment of the present invention. In the present embodiment, the backlight module 201 includes a frame 202, the aforementioned light source module 100 and the light guide plate 200. The light source module 100 and the light guide plate 200 are disposed in the frame 202. Moreover, the flexible printed circuit board 102 of the light source module 100 is disposed under the light guide plate 200, and the light-emitting diodes 104 are disposed on the side of the light guide plate 200 near the light-incident surface 200a. A reflector 203 is disposed on the light guide plate 200 near the light-incident surface 200a, and another reflector 204 and an optical film 205 are respectively disposed on a bottom surface and a light-emitting surface of the light guide plate 200. In addition, in the present embodiment, a bottom surface 202a of the frame 202 has a folding portion 202b which can create a drop height on the bottom surface 202a to match different thicknesses of the flexible printed circuit board 102 and the reflector 204, thereby aligning the light-incident surface 200a of the light guide plate 200 with the light-emitting surfaces 104a of the light-emitting diodes 104.

In addition, as shown in FIG. 1C, in the present embodiment, light 105 emitted from each of the light-emitting diodes 104 is scattered into the light guide plate 200, so that overlapped portions of the diffuse light 105 emitted from every two adjacent light-emitting diodes 104 are particularly bright. Therefore, the first light-absorbing portions 106 are alternately arranged with the light-emitting diodes 104 (i.e. central axes S1 of the first light-absorbing portions 106 are not aligned with central axes S2 of the light-emitting diodes 104, and each of the central axes S2 of the light-emitting diodes 104 extends between adjacent two first light-absorbing portions 106), thereby enabling the light emitted forwards from the light-emitting diodes 104 to enter the light guide plate 200 directly. Meanwhile, portions of the light emitted laterally from the light-emitting diodes 104 through the first light-absorbing portions 106 will be absorbed, and portions of the light emitted from the light-emitting diodes 104 through the blank portion 108 will be reflected into the light guide plate 200. Consequently, the light guide plate 200 not only can have better luminance, but also can be prevented from generating the bright bands near the light-incident surface 200a.

Referring to FIG. 1A-FIG. 1C, each of the first light-absorbing portions 106 is a coating-layer structure formed by painting or printing. Moreover, the color of the coating-layer structure can be black, gray, or gray-to-black gradient color according to the luminous intensities of the light-emitting diodes 104. The black coating-layer structure is used to absorb portions of the light emitted from the light-emitting diodes 104, and the gray coating-layer structure is used to absorb and reflect the light emitted from the light-emitting diodes 104 simultaneously. It is noted that the aforementioned "gray" includes different shades of gray, such as light gray, dark gray, etc. Different shades of gray or gray-to-black gradient color can meet different structural designs requirements of the light-emitting diodes 104 and the light guide plate 200.

In the examples of FIG. 1A-FIG. 1C, the first light-absorbing portions 106 may have different designs. Referring to FIG. 2, FIG. 2 is a schematic structural diagram showing a first light-absorbing portion 106a in accordance with the first embodiment of the present invention. In the example shown in FIG. 2, the first light-absorbing portion 106a is formed by arranging plural dots A1 on the flexible printed circuit board 102. Similarly, the color of the dots A1 can be black, gray, or a color combination of black and gray according to luminous intensity of the light-emitting diodes 104. Meanwhile, the arrangements, sparse density, sizes or color intensity levels of the dots A1 can be varied with the design requirements of the light source module 100.

Figure 3A:
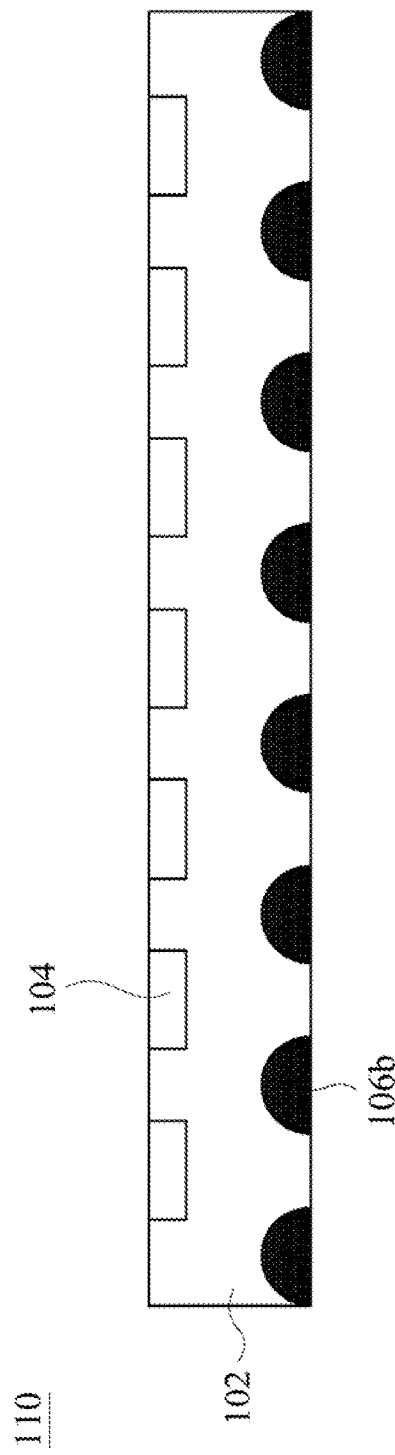
FIG. 3A and FIG. 3B are schematic diagrams showing two types of light source modules in accordance with the first embodiment of the present invention.

In the present invention, the light source module 100 may have different designs. Referring to FIG. 3A, FIG. 3A is a schematic top view of another light source module 110 in accordance with the first embodiment of the present invention. In the present example, the light source module 110 is similar to the aforementioned light source module 100, and the main difference therebetween is that the first light-absorbing portions 106b have different shapes from the first light-absorbing portions 106a. As shown in FIG. 3A, each of the first light-absorbing portions 106b is semi-circular.

Figure 3B:
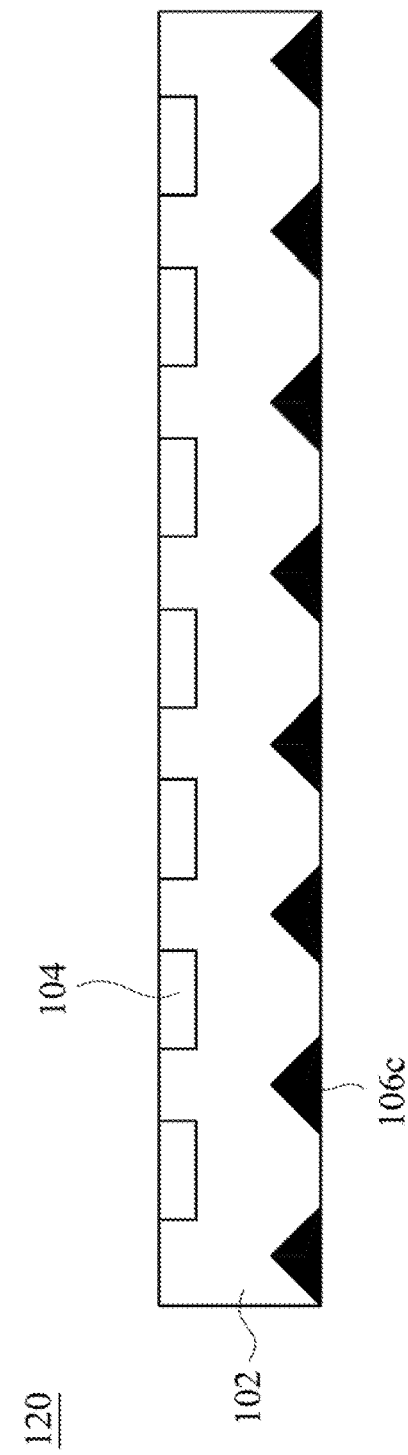

Referring to FIG. 3B, FIG. 3B is a schematic top view of another light source module 120 in accordance with the first embodiment of the present invention. In the present example, the light source module 120 is similar to the aforementioned light source module 100, and the main difference therebetween is that the first light-absorbing portions 106c have different shapes from the first light-absorbing portions 106a. As shown in FIG. 3B, each of the first light-absorbing portions 106c is triangular. Similarly, each of the first light-absorbing portions 106b and 106c shown in FIGS. 3A and 3B is a coating-layer structure formed by painting or printing, or by arranging plural dots on the flexible printed circuit board 102.

Simultaneously referring to FIG. 4A and FIG. 4B, FIG. 4A and FIG. 4B are schematic diagrams showing two types of light source modules 300 and 310 in accordance with a second embodiment of the present invention. In the example shown in FIG. 4A, the light source module 300 is similar to the aforementioned light source module 100, and the main difference therebetween is that the light source module 300 further includes plural second light-absorbing portions 107. The second light-absorbing portions 107 are respectively disposed between every two adjacent first light-absorbing portions 106. In the example shown in FIG. 4A, the first light-absorbing portions 106 and the second light-absorbing portions 107 are different coating-layer structures. In other words, the first light-absorbing portions 106 and the second light-absorbing portions 107 can be designed with different colors according to the luminous intensity or light-emitting direction of the light-emitting diodes 104. For example, the first light-absorbing portions 106 are black coating layers or deep-color coating layers, and the second light-absorbing portions 107 are gray coating layers or light-color coating layers. Therefore, the first light-absorbing portions 106 and the second light-absorbing portions 107 may have different light-absorbing abilities, for example, the light-absorbing ability of first light-absorbing portions 106 is greater than the light-absorbing ability of the second light-absorbing portions 107, or the light-absorbing ability of the second light-absorbing portions 107 is greater than the light-absorbing ability of the first light-absorbing portions 106.

On the other hand, the light source module 310 shown in the example of FIG. 4B is similar to the aforementioned light source module 300, and the main difference therebetween is that the first light-absorbing portions 106 and the second light-absorbing portions 107 are in the same coating-layer structure, so that the light-absorbing ability of the first light-absorbing portions 106 is equal to the light-absorbing ability of the second light-absorbing portions 107. In the present example, the first light-absorbing portions 106 and the second light-absorbing portions 107 are connected to form a stripe of coating-layer structure. In addition, the coating-layer structure is black, gray, or a gradient color from gray to black along a direction from the first edge 102a to the second edge 102b.

Figure 5A:
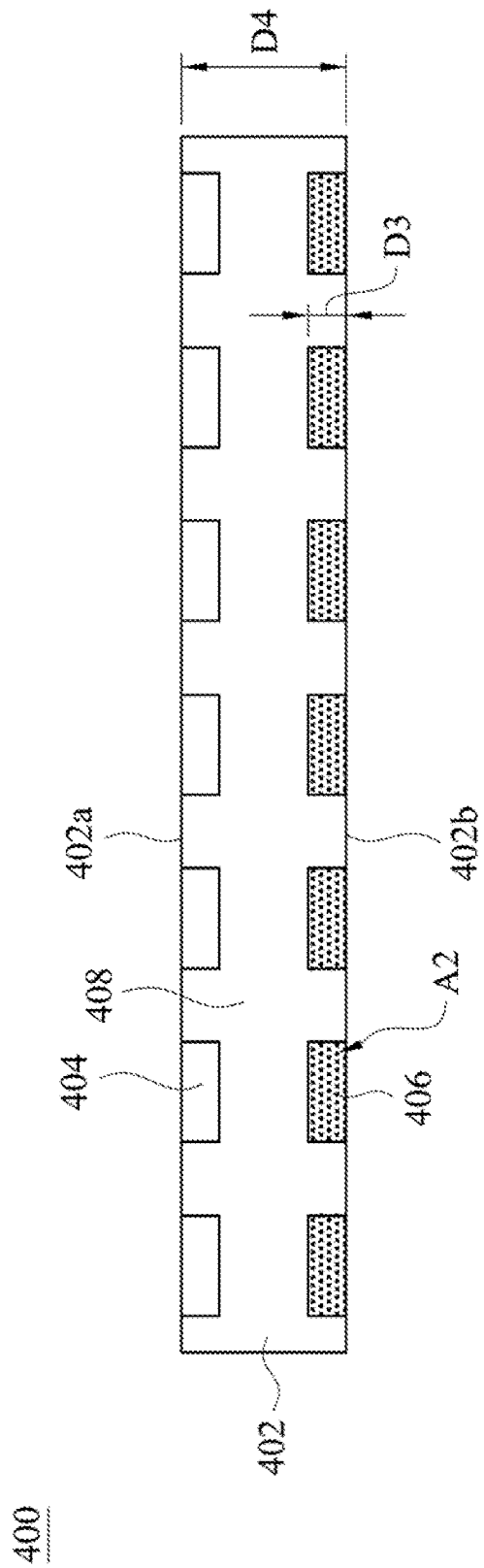
FIG. 5A is a schematic top view of a light source module in accordance with a third embodiment of the present invention.
Figure 5B:
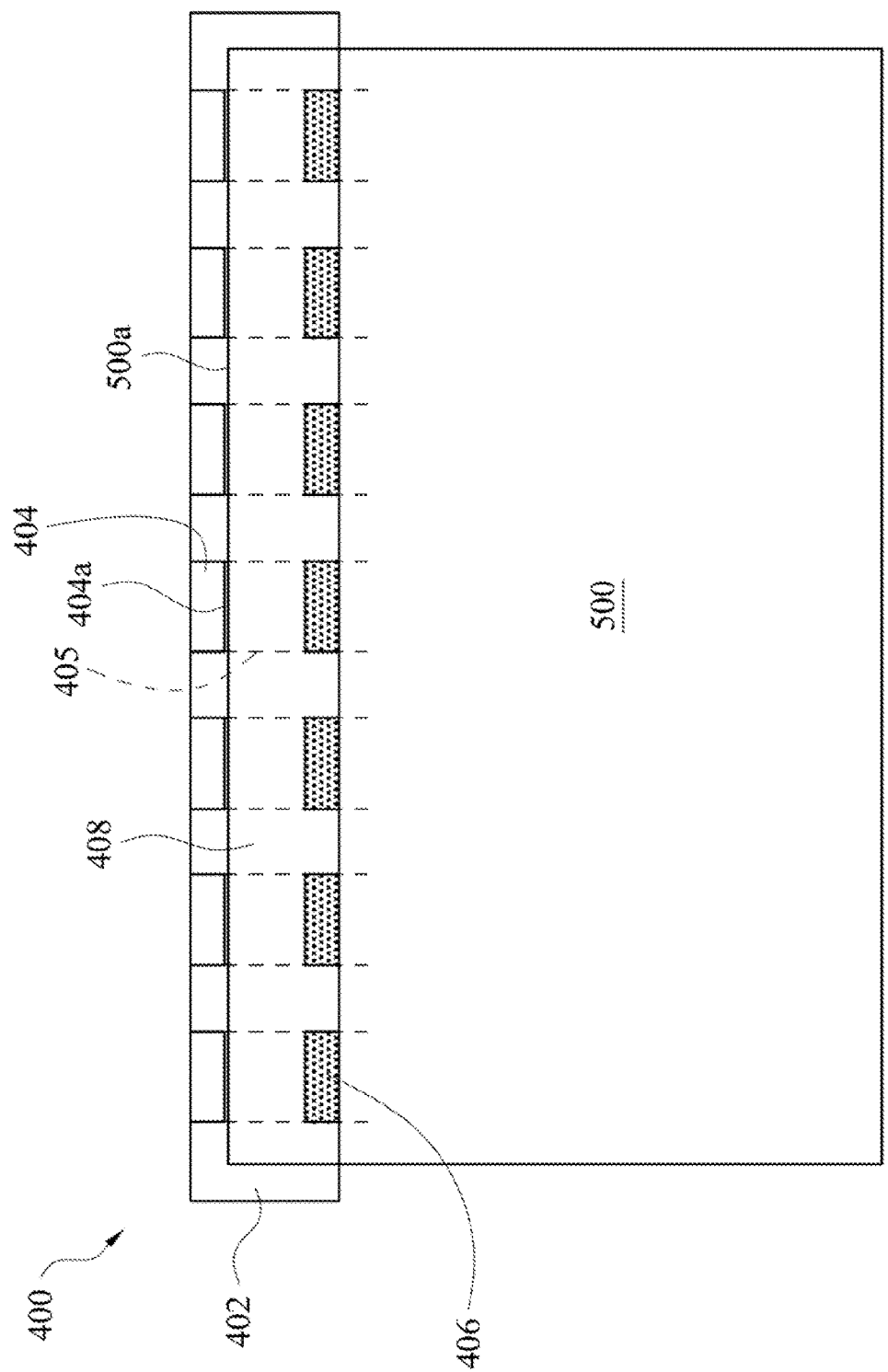
FIG. 5B is a schematic diagram showing the light source module in operation in accordance with the third embodiment of the present invention.

Referring to FIG. 5A and FIG. 5B, FIG. 5A is a schematic top view of a light source module 400 in accordance with a third embodiment of the present invention, and FIG. 5B is a schematic diagram showing the light source module 400 in operation in accordance with the third embodiment of the present invention. In the present embodiment, the light source module 400 includes a flexible printed circuit board 402, plural light-emitting diodes 404 and plural first light-absorbing portions 406. The flexible printed circuit board 402 has a first edge 402a and a second edge 402b opposite to each other. The light-emitting diodes 404 are disposed on the flexible printed circuit board 402 near the first edge 402a. The light-emitting diodes 404 are electrically connected to the flexible printed circuit board 402. The first light-absorbing portions 406 disposed on the flexible printed circuit board 402 near the second edge 402b.

As shown in FIG. 5B, when being applied to the backlight module, a portion of a light guide plate 500 near the light-emitting diodes 404 is disposed on the flexible printed circuit board 402 and covers the first light-absorbing portions 406. Moreover, in the present embodiment, each of the light-emitting diodes 404 emits light along a forward direction, so that the first light-absorbing portions 406 are arranged corresponding to the light-emitting diodes 404 respectively to absorb portions of the light 405 emitted from the light-emitting diodes 404. In other words, the light-emitting diodes 404 and the first light-absorbing portions 406 are aligned with each other, and the first light-absorbing portions 406 are faced with the light-emitting diodes 404 one by one. As shown in FIG. 5B, there is a blank portion 408 located between the first light-absorbing portions 406 and the light-emitting diodes 404. The blank portion 408 is used to reflect light emitted from the light-emitting diodes 404 or a bottom surface of the light guide plate 500 back to the light guide plate 500. In one embodiment, a distance D3 from a top end of each of the first light-absorbing portions 406 to the second edge 402b is smaller than one half of a distance D4 from the first edge 402a to the second edge 402b, in which the aforementioned "distance D3" refers to a length of the first light-absorbing portions 406 along a direction from the first edge 402a to the second edge 402b.

Figure 6A:
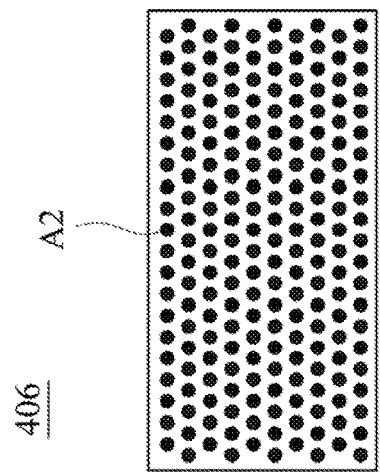
FIG. 6A-FIG. 6C are schematic structural diagrams showing three types of first light-absorbing portions in accordance with the third embodiment of the present invention.

Simultaneously referring to FIG. 5A, FIG. 5B and FIG. 6A, FIG. 6A is schematic structural diagrams showing first light-absorbing portions 406 in accordance with the third embodiment of the present invention. In the present embodiment, each of the first light-absorbing portions 406 is formed by arranging plural dots A2 on the flexible printed circuit board 402. Moreover, the color of the dots A2 can be black, gray, or a color combination of black and gray according to the luminous intensities of the light-emitting diodes 404. Meanwhile, the arrangements, sparse density, sizes or color intensity levels of the dots A2 can be varied with the design requirements of the light source module 400. In other embodiments, each of the first light-absorbing portions 406 can be a coating-layer structure formed by painting or printing.

Figure 6B:
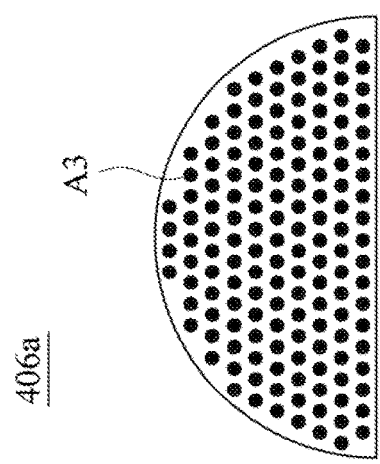
Figure 6C:
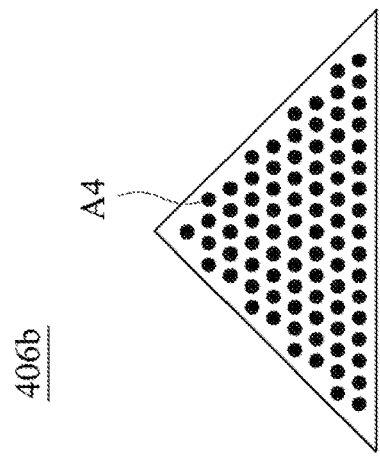

In the example shown in FIG. 5A, the first light-absorbing portions 406 may have different designs. Simultaneously referring to FIG. 6B and FIG. 6C, FIG. 6B and FIG. 6C are schematic structural diagrams showing different types of first light-absorbing portions 406a and 406b in accordance with the third embodiment of the present invention. In the example shown in FIG. 6B, each of the first light-absorbing portions 406a is formed by arranging plural dots A3 on the flexible printed circuit board 402, and a profile of each of the first light-absorbing portions 406a is semi-circular. In the example shown in FIG. 6C, each of the first light-absorbing portions 406b is formed by arranging plural dots A4 on the flexible printed circuit board 402, and a profile of each of the first light-absorbing portions 406b is triangular.

Figure 7C:
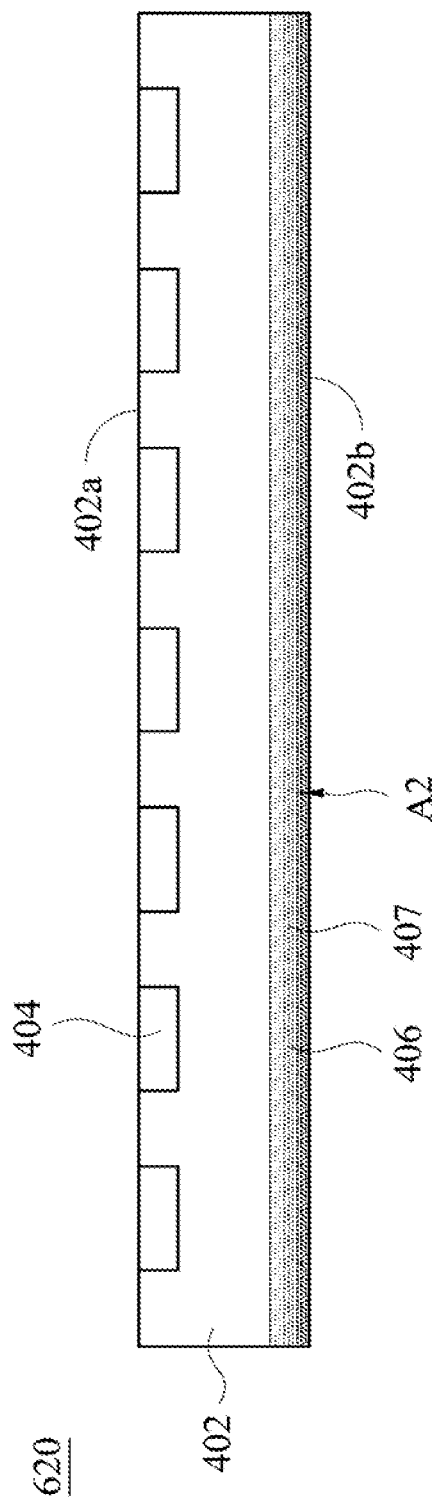

Referring to FIG. 7A-FIG. 7C, FIG. 7A and FIG. 7C are schematic structural diagrams showing two types of light source modules 600,610 and 620 in accordance with the fourth embodiment of the present invention. In the example shown in FIG. 7A, the light source module 600 is similar to the aforementioned light source module 400, and the main difference therebetween is that the light source module 600 further includes plural second light-absorbing portions 407. The second light-absorbing portions 407 are respectively disposed between every two adjacent first light-absorbing portions 406. In one embodiment, each of the second light-absorbing portions 407 is a coating-layer structure formed by painting or printing, or formed by arranging plural dots on the flexible printed circuit board 402.

In the example shown in FIG. 7A, the first light-absorbing portions 406 and the second light-absorbing portions 407 are respectively formed by arranging different dots A2 and A5 on the flexible printed circuit board 402. Moreover, sizes, colors or arrangements of the dots A2 and A5 can be designed according to the luminous intensities or light-emitting directions of the light-emitting diodes 404. For example, each of the first light-absorbing portions 406 is formed by arranging black dots or deep-color dots on the flexible printed circuit board 402, and each of the second light-absorbing portions 407 is formed by arranging gray dots or light-color dots on the flexible printed circuit board 402. In other examples, each of the first light-absorbing portions 406 is formed by arranging larger-sized dots or thinly-arranged dots on the flexible printed circuit board 402, and each of the second light-absorbing portions 407 is formed by arranging smaller-sized dots or densely-arranged dots on the flexible printed circuit board 402. Therefore, the first light-absorbing portions 406 and the second light-absorbing portions 407 may have different light-absorbing abilities. For example, the light-absorbing ability of the first light-absorbing portions 406 is greater than light-absorbing ability of the second light-absorbing portions 407, or the light-absorbing ability of the second light-absorbing portions 407 is greater than the light-absorbing ability of the first light-absorbing portions 406.

As shown in FIG. 7B, In the example shown in FIG. 7B, the light source module 610 is similar to the aforementioned light source module 600, and the main difference therebetween is that each of the first light-absorbing portions 406 and the second light-absorbing portions 407 is formed by arranging the same dots A2 on the flexible printed circuit board 402, so that the light-absorbing ability of the first light-absorbing portions 406 is equal to the light-absorbing ability of the second light-absorbing portions 407. Similarly, arrangements, sparse density, sizes or color intensity levels of the dots A2 can be varied with the design requirements of the light source module 610. As shown in FIG. 7C, the light source module 620 is similar to the aforementioned light source module 610. Moreover, the dots A2 near the first edge 402a are thinly-arranged, and the dots A2 near the second edge 402b are densely-arranged. In other embodiments, the dots A2 near the first edge 402a are gray, and the dots A2 near the second edge 402b are black.

According to the aforementioned embodiments of the present invention, the first light-absorbing portions are used to absorb portions of the light emitted from the light-emitting diodes. Meanwhile, the blank portion is used to reflect portions of the light emitted from the light-emitting diodes. Therefore, when the light source module of the present invention is applied to the backlight modules, bright bands can be prevented from being generated near the light-incident surface of the light guide plate, thereby increasing luminance of the light guide plate.

According to the aforementioned embodiments of the present invention, disposing location of the first light-absorbing portions can be changed or the second light-absorbing portions can be additionally implemented according to the luminous intensity or light-emitting direction of the light-emitting diodes so as to meet actual requirements. In addition, by changing colors, types or shapes of the first light-absorbing portions and the second light-absorbing portions can prevent the light guide plate from generating bright bands.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light source module, comprising:
a flexible printed circuit board having a planar mounting surface, a first edge and a second edge opposite to the first edge, wherein the first edge and the second edge are both on the planar mounting surface;
a plurality of light-emitting diodes disposed on the planar mounting surface of the flexible printed circuit board;
a plurality of first light-absorbing portions disposed on the planar mounting surface of the flexible printed circuit board, wherein the first light-absorbing portions and the light-emitting diodes are located along the first edge and the second edge of the flexible printed circuit board in a staggered arrangement; and
a blank portion disposed on the planar mounting surface of the flexible printed circuit board between the first light-absorbing portions and the light-emitting diodes;
wherein each of the light-emitting diodes has a central axis and each of the central axes extends between adjacent two first light-absorbing portions; and
wherein the first light-absorbing portions are separated from the light-emitting diodes by a width which extends along the central axes of light-emitting diodes.

2. The light source module of claim 1, wherein each of the first light-absorbing portions is a coating-layer structure or formed by arranging a plurality of dots on the flexible printed circuit board.

3. The light source module of claim 2, wherein the color of the coating-layer structure is black, gray, or gray-to-black gradient color.

4. The light source module of claim 2, wherein the color of the dots is black, gray, or a color combination of black and gray.

5. The light source module of claim 1, wherein a profile of each of the first light-absorbing portions is triangular, rectangular or semi-circular.

6. The light source module of claim 1, further comprising a plurality of second light-absorbing portions respectively disposed between every two adjacent first light-absorbing portions.

7. The light source module of claim 6, wherein the light-absorbing ability of the first light-absorbing portions is equal to the light-absorbing ability of the second light-absorbing portions.

8. The light source module of claim 6, wherein the light-absorbing ability of the first light-absorbing portions is greater than the light-absorbing ability of the second light-absorbing portions.

9. The light source module of claim 6, wherein the light-absorbing ability of the second light-absorbing portions is greater the light-absorbing ability of the first light-absorbing portions.

10. The light source module of claim 6, wherein a distance from a top end of each of the first light-absorbing portions and the second light-absorbing portions to the second edge is smaller than one half of a distance from the first edge to the second edge.

11. A light source module, comprising:
a flexible printed circuit board having an upper surface and a lower surface, and a first edge and a second edge opposite to the first edge on the upper surface;
a plurality of light-emitting diodes disposed on the flexible printed circuit board;
a plurality of first light-absorbing portions disposed on the flexible printed circuit board, wherein the first light-absorbing portions and the light-emitting diodes are located on the upper surface of the flexible printed circuit board and respectively along the first edge and the second edge of the flexible printed circuit board in a staggered arrangement; and
a blank portion disposed between the first light-absorbing portions and the light-emitting diodes.

12. The light source module of claim 11, wherein:
the flexible printed circuit board has a width that extends from the first edge to the second edge thereof to thereby define a width direction of the flexible printed circuit board, and a length that extends in a direction perpendicular to the width direction to thereby define a length direction of the flexible printed circuit board;
each of the first light-absorbing portions and each of the light-emitting diodes has a width that extends in the width direction of the flexible printed circuit board, and a length that extends in the length direction of the flexible printed circuit board; and
a line extending in the width direction of the flexible printed circuit board and passing through a center of each of the light-emitting diodes along the length thereof is unaligned and staggered with a line extending in the width direction of the flexible printed circuit board and passing through a center of any adjacent one of the first light-absorbing portions along the length thereof.

13. The light source module of claim 12, wherein the width of each of the first light-absorbing portions and each of the light-emitting diodes is less than half of the width of the flexible printed circuit board.

14. The light source module of claim 11, wherein each of the first light-absorbing portions is a coating-layer structure or formed by arranging a plurality of dots on the flexible printed circuit board.

15. The light source module of claim 14, wherein the color of the coating-layer structure is black, gray, or gray-to-black gradient color.

16. The light source module of claim 14, wherein the color of the dots is black, gray, or a color combination of black and gray.

17. The light source module of claim 11, wherein a profile of each of the first light-absorbing portions is triangular, rectangular or semi-circular.

\* \* \* \* \*